United States Patent [19]

Nagata

[11] 4,156,849
[45] May 29, 1979

[54] DISPLAY DEVICE IN ELECTRICAL EQUIPMENT

[75] Inventor: Yuichi Nagata, Hamamatsu, Japan

[73] Assignee: Nippon Gakki Seizo Kabushiki Kaisha, Hamamatsu, Japan

[21] Appl. No.: 822,453

[22] Filed: Aug. 5, 1977

[30] Foreign Application Priority Data

Aug. 12, 1976 [JP] Japan .................................. 51/96489

[51] Int. Cl.² .................... H04B 1/16; H04B 17/00
[52] U.S. Cl. .................................... 325/364; 325/455
[58] Field of Search ............... 325/344, 363, 364, 398, 325/455; 324/115

[56] References Cited

U.S. PATENT DOCUMENTS

| | | | |
|---|---|---|---|
| 2,808,467 | 10/1957 | Baumgartner | 325/455 |
| 3,311,838 | 3/1967 | Danker | 325/455 |
| 3,525,045 | 8/1970 | Von Recklinghausen | 325/363 |
| 3,862,354 | 1/1975 | Kawamata et al. | 325/455 |
| 4,059,802 | 11/1977 | Ohsawa et al. | 325/398 |

*Primary Examiner*—Robert L. Griffin
*Assistant Examiner*—Marc E. Bookbinder
*Attorney, Agent, or Firm*—C. Bruce Hamburg

[57] ABSTRACT

A display device includes a single meter which can be selectively employed as a signal meter indicating a strength level of a received radio wave and an output level meter indicating an output level of an amplifier. The display device is so designed that the meter is automatically caused to operate as the signal meter when a person touches the tuning knob of a tuner section, otherwise the meter operates as the output level meter. A switch may be provided to restrict the meter function to that of the signal meter regardless of a person's touching of the tuning knob.

15 Claims, 5 Drawing Figures

DISPLAY DEVICE IN ELECTRICAL EQUIPMENT

BACKGROUND OF THE INVENTION

This invention relates to display devices in electrical equipment, such as for instance a radio receiver, incorporating a tuner section and an output amplifier section (a preamplifier and a main amplifier).

In general, the provision of a signal meter indicating the radio wave strength of an antenna input and a tuning meter indicating a tuning point with its pointer at the zero point in the scale thereof by utilizing the "S"-shaped characteristic curve of an FM demodulator is desirable in order to precisely indicate a tuning point of the tuner section of such electrical equipment as described above, and in addition it is also desirable to provide a pair of output level meters respectively indicating the right and left channel output levels for the output amplifier section. Accordingly it is necessary to provide the electrical equipment with four meters in total. Therefore the conventional electrical equipment of this type suffers from drawbacks that the area of the panel board where the meters are provided must be relatively large and accordingly the manufacturing cost of the electrical equipment is increased proportionately.

SUMMARY OF THE INVENTION

Accordingly a primary object of this invention is to provide a display device in electrical equipment in which the number of meters is reduced.

Another object of the invention is to provide a display device is electrical equipment in which the manufacturing cost thereof can be reduced, and the area of a panel board available for use by elements other than meters is increased.

A further object of the invention is to provide a display device in electrical equipment in which a meter switching operation is avoided so that the electrical equipment can be readily operated.

This invention has been developed based on the fact that while a signal meter is scarcely needed when the station selecting operation or the tuning operation is not carried out, an output level meter is needed when a broadcast signal is received after completion of station selecting operation and when information recorded on a phonographic disk or in a magnetic tape is reproduced.

The display device according to this invention comprises at least one meter, and a meter selection control circuit which operates to cause the meter to selectively display the radio wave strength of an antenna input in the tuner section of electrical equipment or the output level of the output amplifier section thereof.

According to a preferred example of this invention, the aforementioned meter selection control circuit comprises a touch detection circuit which, when a person touches the tuning knob of the tuner section with his finger or hand, produces a touch detection signal, and a switching circuit which operates in response to the output signal of the touch detection circuit to control the meter in such a manner that the meter displays the radio wave strength when a person touches the tuning knob and the output level of the output amplifier section when the person does not touch the tuning knob.

The novel features which are considered characteristic of this invention are set forth in the appended claims. This invention itself, however, together with additional objects and advantages thereof will be best understood from the following description taken in conjunction with the accompanying drawings which illustrate, by way of example only, some preferred embodiments of the invention. In the accompanying drawings, like parts are designated by like reference numerals or characters.

DETAILED DESCRIPTION OF THE INVENTION

Figure 1:
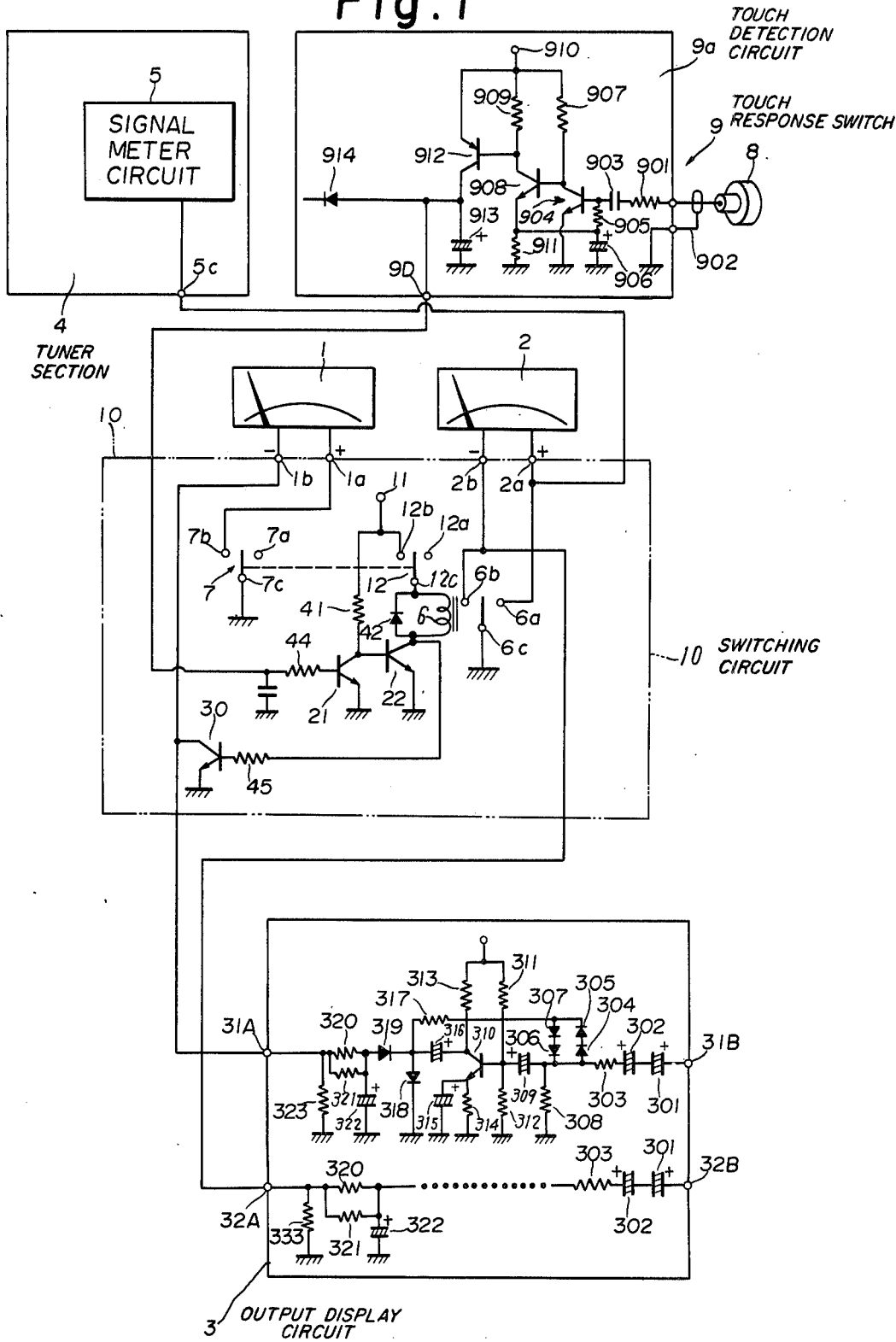
FIG. 1 is a schematic circuit diagram, partly in the form of a block diagram, illustrating a first example of a display device according to this invention.

Shown in FIG. 1 is a circuit diagram illustrating a first embodiment of this invention, which comprises a pair of meters 1 and 2 arranged side by side for indicating voltage levels (hereinafter referred to as a left side meter 1 and a right side meter 2, respectively, when applicable). The output terminals 31A and 32A for the left and right channels of an output display circuit 3 are connected respectively to the negative terminals 1b and 2b of the meters 1 and 2. This output display circuit 3 is to perform logarithmic amplification of the amplified output voltages for the left and right channels applied to the input terminals 31B and 32B of the output display circuit 3 from an output amplifier section (not shown) and to output the voltages thus amplified through the output terminals 31A and 32A.

The left channel is made up of an electrolytic capacitor 301 whose positive terminal is connected to the input terminal 31B, an electrolytic capacitor 302 whose negative terminal is connected to the negative terminal of the electrolytic capacitor 301, a resistor 303 connected in series to the electrolytic capacitor 302, an electrolytic capacitor 309 whose negative terminal is connected to the resistor 303, a resistor 308 connected between the junction of the resistor 303 and the electrolytic capacitor 309 and the ground point, a transistor 310 whose base is connected to the positive terminal of the electrolytic capacitor 309, base bias resistors 311 and 312 for this transistor 310, a load resistor 313 of the transistor 310, an emitter bias (self-bias) resistor 314 of the transistor 310, an electrolytic capacitor 315 connected in parallel to the resistor 314 for shunting AC components, an electrolytic capacitor 316 whose positive terminal is connected to the collector of the transistor 310, a diode 318 connected between the negative terminal of the electrolytic capacitor 316 and the ground point, a diode 319 whose cathode is connected to the negative terminal of the electrolytic capacitor 316, a resistor 317 connected between the junction of the electrolytic capacitor 316 and the diode 319 and a series-parallel connection of diodes 304, 305, 306 and 307 which in turn is connected to the junction of the electrolytic capacitor 309 and the resistor 303 to constitute a logarithmic amplifier together with the transistor 310, an electrolytic capacitor 322 connected between the anode of the diode 319 and the ground point, a parallel circuit constituted by two resistors 320 and 321, the parallel circuit being connected in series to the diode 319, and a resistor 323 connected between the output side of the resistors 320 and 321 and the ground point.

The arrangement of the right channel is similar to that of the left channel described above. Since the operation of the output display circuit 3 is substantially identical to that of a conventional output display circuit employed in preamplifiers, main amplifiers, and so forth, the detailed description of the operation will be omitted.

Connected to the positive terminal 2a of the right side meter 2 is a signal strength output terminal 5C of a signal meter circuit 5 adapted to pick up a radio wave strength of an antenna input to a tuner section 4. This signal meter circuit 5 is so designed that an intermediate frequency signal is obtained through a coupling capacitor from an intermediate frequency amplifier stage and is subjected to rectification (these elements being not shown). The positive and negative terminals 2a and 2b of the right side meter 2 are connected respectively to stationary contacts 6a and 6b of an electromagnetic relay 6, the stationary contacts being selectively grounded by means of a movable contact 6c of the electromagnetic relay 6. On the other hand, the positive terminal 1a of the left side meter 1 is connected to one 7b of the stationary contacts 7a and 7b of a first meter change-over switch 7, and is selectively set in grounded state and non-grounded state by the switching operation of a movable contact 7c of the change-over switch 7.

A touch detection circuit 9a is to detect the fact that a person touches a tuning knob 8. More specifically, since interior wiring is installed in a room where electrical equipment such as a radio receiver is located, the room is filled with magnetic flux and therefore an induction voltage at the power supply frequency is developed in a person in the room. Accordingly, when the person touches the tuning knob 8, an induction voltage at the power supply frequency is applied to the touch detection circuit. In the case where a person does not touch the tuning knob 8, the potential at the output terminal 9D of the touch detection circuit 9a is maintained low. However, when he touches the tuning knob 8, the potential at the output terminal 9D is increased thereby to produce a touch detection output. The touch detection circuit 9a will be further described so as to be conducive to a full understanding of this invention. The touch detection circuit 9a is made up of a resistor 901 which is connected to the tuning knob 8, a capacitor 903 connected in series to the resistor 901, a transistor 904 whose base is connected to the capacitor 903, the emitter thereof grounded, the collector thereof connected a power supply terminal 910 through a resistor 907, a series circuit formed by a resistor 905 and a capacitor 906, (for stabilizing the base bias voltage), this series circuit being connected between the base of the transistor 904 and the ground point, a transistor 908 whose base is connected to the collector of the transistor 904, the collector of the transistor 908 connected to the power supply terminal 910 through a resistor 909, the emitter of the same transistor 908 grounded through a resistor 911, a feedback path connecting the emitter of the transistor 908 and the junction of the resistor 905 and capacitor 906, and a transistor 912 whose base is connected to the collector of the transistor 908, the emitter of the transistor 912 connected to the power supply terminal 910, the collector of the transistor 912 grounded through an electrolytic capacitor 913.

The induction AC voltage applied through the tuning knob 8 is amplified by the transistors 904 and 908. The induction voltage thus amplified is employed to change the base bias of the transistor 912. In its negative cycle, the transistor 912 is rendered conductive, and current is allowed to flow into the capacitor 913 from the power supply terminal 910. As a result, the capacitor is charged to increase the potential at the output terminal 9D (or to produce the touch detection signal). In the case when the person does not touch the tuning knob 8, the transistor 912 is maintained non-conductive. Therefore the capacitor 913 is not charged and accordingly the potential at the output terminal 9D is maintained low. In other words, it can be said that the tuning knob 8 and the touch detection circuit 9a form a touch response switch 9.

In FIG. 1, reference numeral 902 is intended to designate a shield wire for shielding the lead wire extended between the tuning knob 8 and the resistor 901. That is, the provision of the shield wire prevents the induction of voltage in the lead wire by the external magnetic flux. The diode 914 serves as a connection circuit to an AFC (automatic frequency control) circuit for instance.

The above-described touch response switch 9 forms a meter selection control circuit with a switching circuit 10 which operates in response to the output signal from the touch response switch 9 so that the radio wave strength is displayed on the meter 2 when a person touches the tuning knob 8 and the output levels of the left and right channels of the output amplifier section are displayed on the meters 1 and 2 when the person does not touch the tuning knob. The output terminal 9D of the touch detection circuit 9a is connected to the above-described switching circuit 10 including the aforementioned electromagnetic relay 6. The output terminal 9D is grounded through a capacitor 43 on the one hand and is connected to a transistor 21 through a resistor 44 on the other hand. The switching circuit 10 comprises a relay operation control circuit made up of the transistor 21 whose base is controlled in response to variations in the voltage level at the output terminal 9D whereby its conduction state is changed, and a transistor 22 whose base is controlled in response to potentials at the collector of the transistor 21. The switching circuit 10 further comprises a transistor 30 which is base-controlled in response to potentials at the collector of the transistor 22. In the collector circuit of the transistor 22, or between the collector of the transistor 22 and the power supply terminal 11 there are provided a second meter change-over switch 12 and the above-described electromagnetic relay 6 connected in series. The transistor 30 is connected between the negative terminal 1b of the left side meter 1 and the ground point so that when the transistor 30 is rendered conductive, the negative terminal 1b is grounded. The second switch 12 is interlocked with the first switch 7 and is adapted to open and close the collector circuit of the transistor 22. In the case when the movable contact 7c in the first switch 7 is tripped over to the stationary contact 7a so that the positive terminal 1a of the left side meter 1 is disconnected from the ground, the movable contact 12c of the second switch 12 is connected to the stationary contact 12a thereof so that the flow of current to the collector of the transistor 22 is interrupted. In contrast, in the case when the movable contact 7c of the first switch 7 is connected to the stationary contact 7b so as to ground the positive terminal 1a of the left side meter 1, the movable contact 12c of the second switch 12 is connected to the stationary contact 12b thereof so that current is supplied to the collector of the transistor 22.

Furthermore the electromagnetic relay 6 is so designed that upon energization the movable contact 6c is so moved as to be connected to the stationary contact 6a so as to ground the positive terminal 2a of the right side meter 2, while upon deenergization the movable contact is so moved as to be connected to the other stationary contact 6b so as to ground the negative terminal 2b of the right side meter 2.

The operation of the first example of this invention will be described with reference to FIGS. 2 to 4 in which only essential elements thereof are shown and essential conducting lines are indicated with heavy lines.

Figure 2:
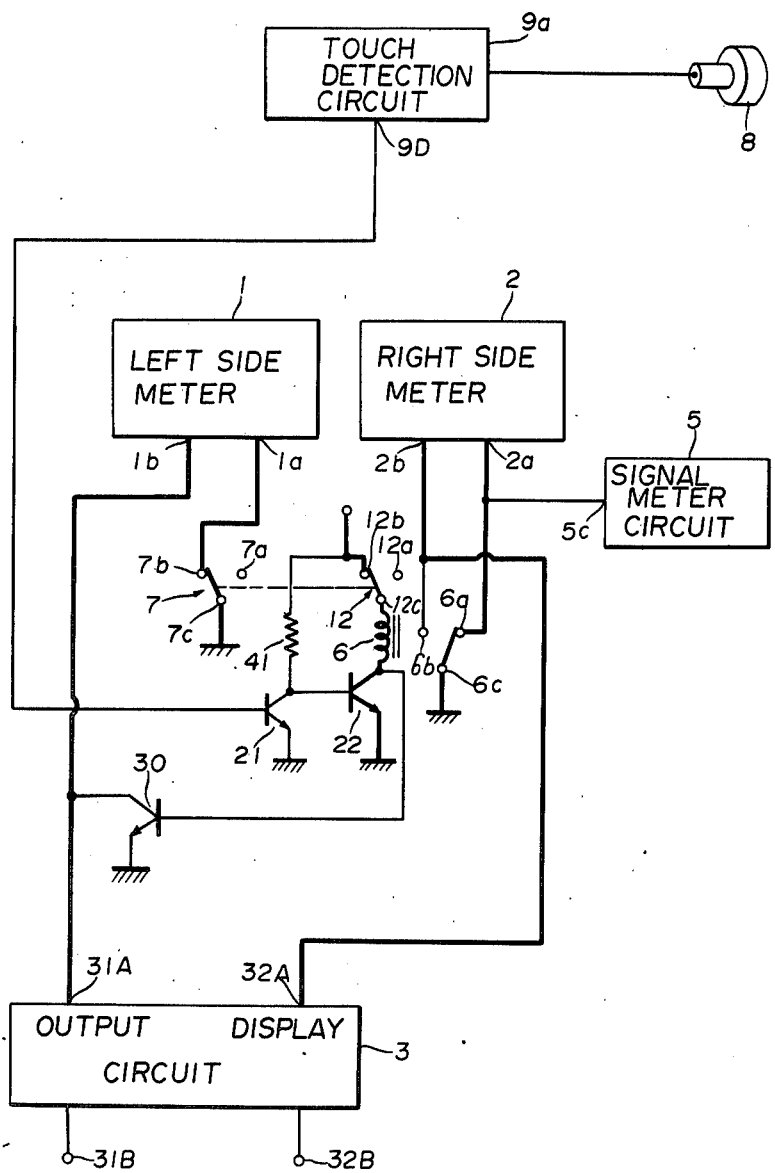
FIGS. 2, 3 and 4 are also schematic circuit diagrams to explain the operation of the first example according to the invention.

FIG. 2 illustrates a state in which the movable contacts 7c and 12c of the first and second switches 7 and 12 are connected to the stationary contacts 7b and 12b, respectively, and a person is not touching the tuning knob 8. In this case, as the detection output terminal 9D of the touch detection circuit 9a is maintained at a low potential, the transistor 21 is in non-conductive state so that the base of the transistor 22 is maintained at a high potential. In addition, as the collector of the transistor 22 is connected through the electromagnetic relay 6 and the second switch 12 to the power supply, the transistor 22 is in conductive state. As a result, the electromagnetic relay 6 is energized. Accordingly, the movable contact 6c of the electromagnetic relay 6 is connected to the contact 6a thereof and the positive terminal 2a of the right side meter 2 is connected to the ground, while the negative terminal 2b is disconnected from the ground. That is, while the signal strength output terminal 5C of the signal meter circuit in the tuner section 4 is grounded, the negative voltage from the right channel output terminal 32A of the output display circuit 3 is applied to the negative terminal 2b of the right side meter 2. Therefore the right side meter indicates the right channel output level of the output amplifier section. In this operation, as the transistor 22 is rendered conductive to lower the collector potential, the transistor 30 is rendered non-conductive. Therefore the left channel output terminal 31A of the output display circuit 3 is not grounded and the left channel output level of the output amplifier section is indicated on the left side meter 1.

Figure 3:
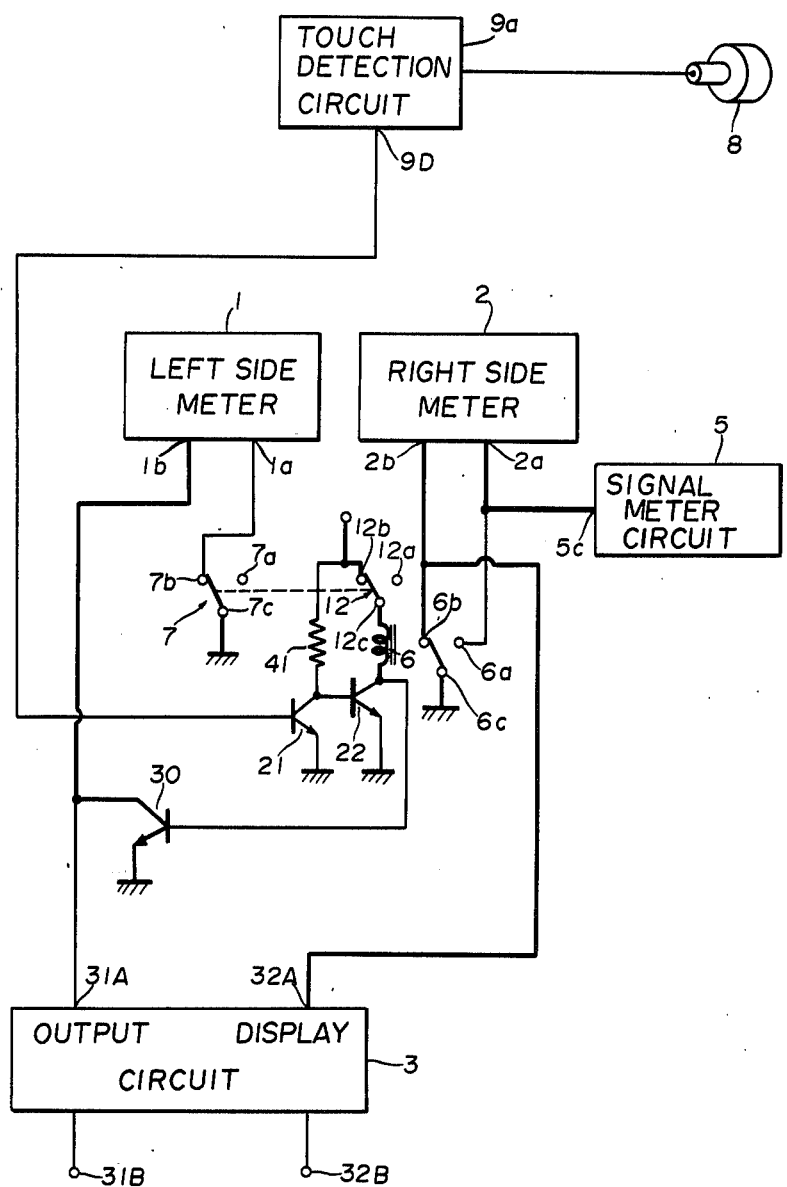

Now, under the condition that the first and second switches 7 and 12 are maintained as shown in FIG. 2, if a person touches the tuning knob 8 for the tuning operation of the tuner section 4, then the state of the circuitry will be changed as indicated in FIG. 3. More specifically, as the potential at the detection output terminal 9D of the touch detection circuit 9a becomes high, the base potential of the transistor 21 is raised to a high level and therefore transistor 21 is rendered conductive. Therefore the base potential of the transistor 22 is lowered to a low level and accordingly the transistor 22 is rendered non-conductive, thereby interrupting the flow of current to the electromagnetic relay 6. As a result the movable contact 6c of the relay 6 is moved so as to be connected to the stationary contact 6b and the negative terminal 2b of the right side meter 2 is grounded. In other words, as the right channel output terminal 32A of the output display circuit 3 is grounded, the right channel output level of the output amplifier section is not displayed by the right side meter 2 and instead the input signal strength from the signal meter circuit 5 of the tuner section 4 is displayed thereby. Since under this condition the collector potential of the transistor 22 is high, the transistor 30 is rendered conductive so that both negative terminal 1b of the left side meter 1 and left channel output terminal 31A of the output display circuit 3 are grounded. Therefore the left channel output level of the output amplifier section is not indicated on the left side meter.

Figure 4:
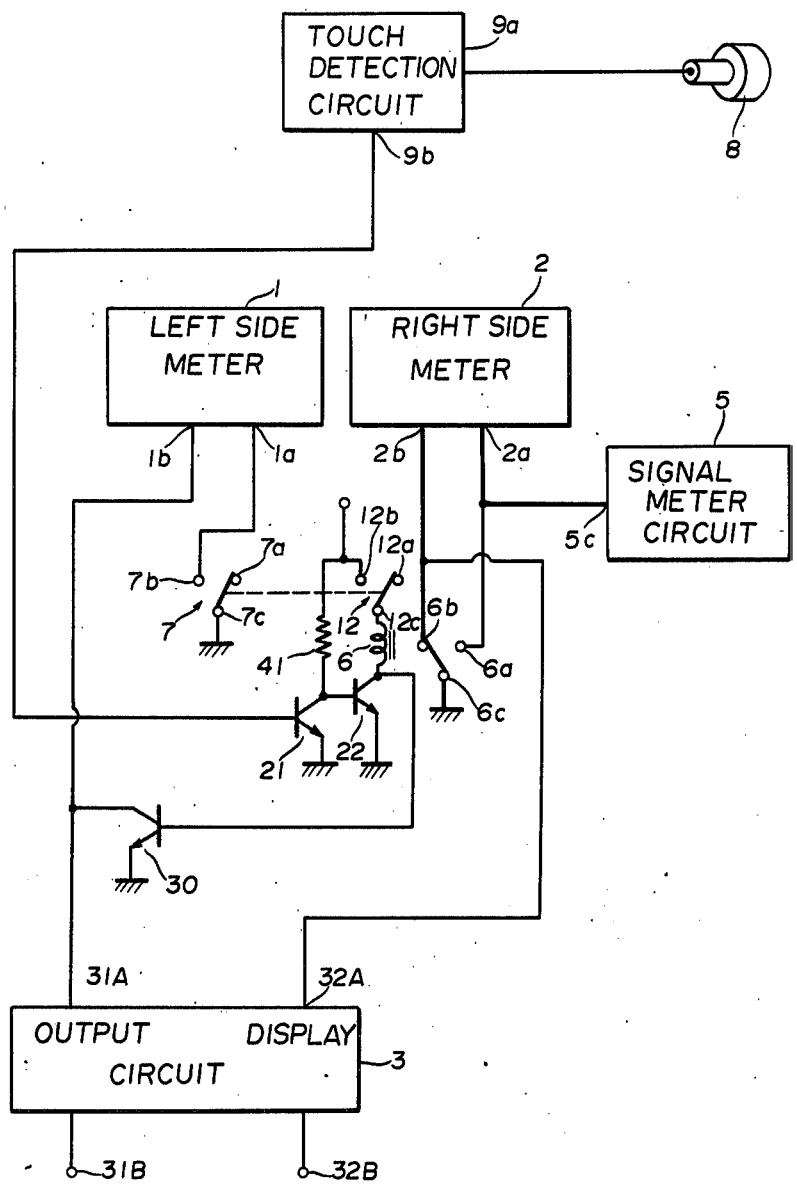

If the movable contacts 7c and 12c of the first and second switches 7 and 12 are connected to the stationary contacts 7a and 12a, respectively, as illustrated in FIG. 4, then the positive terminal 1a of the left side meter 1 is disconnected from the ground to render the left side meter 1 inoperable, which does not indicate the left channel output of the output amplifier section. In addition, as the collector circuit of the transistor 22 is opened, no current flows in the electromagnetic relay 6 regardless of the potential level at the detection output terminal 9D of the touch detection circuit 9a. Therefore the movable contact 6c of the electromagnetic relay 6 is maintained connected to the stationary contact 6b thereof and accordingly the positive terminal 2a of the right side meter 2 is free from the ground potential and the negative terminal 2b is in turn grounded. Thus, similarly as in the case of FIG. 3, the right side meter 2 does not indicate the right channel output level of the output amplifier section but indicates the signal strength from the signal meter circuit 5 of the tuner section. Unlike the afore-described case, this condition is not affected by the potential level at the touch detection output terminal 9D. Therefore no change is observed whether the person touches the tuning knob 8 or not. In other words, by tripping the movable contacts 7c and 12c of the first and second switches 7 and 12 to the stationary contacts 7a and 12a, respectively, the right side meter 2 can be held to indicate the radio wave strength of the antenna input at all times.

Figure 5:
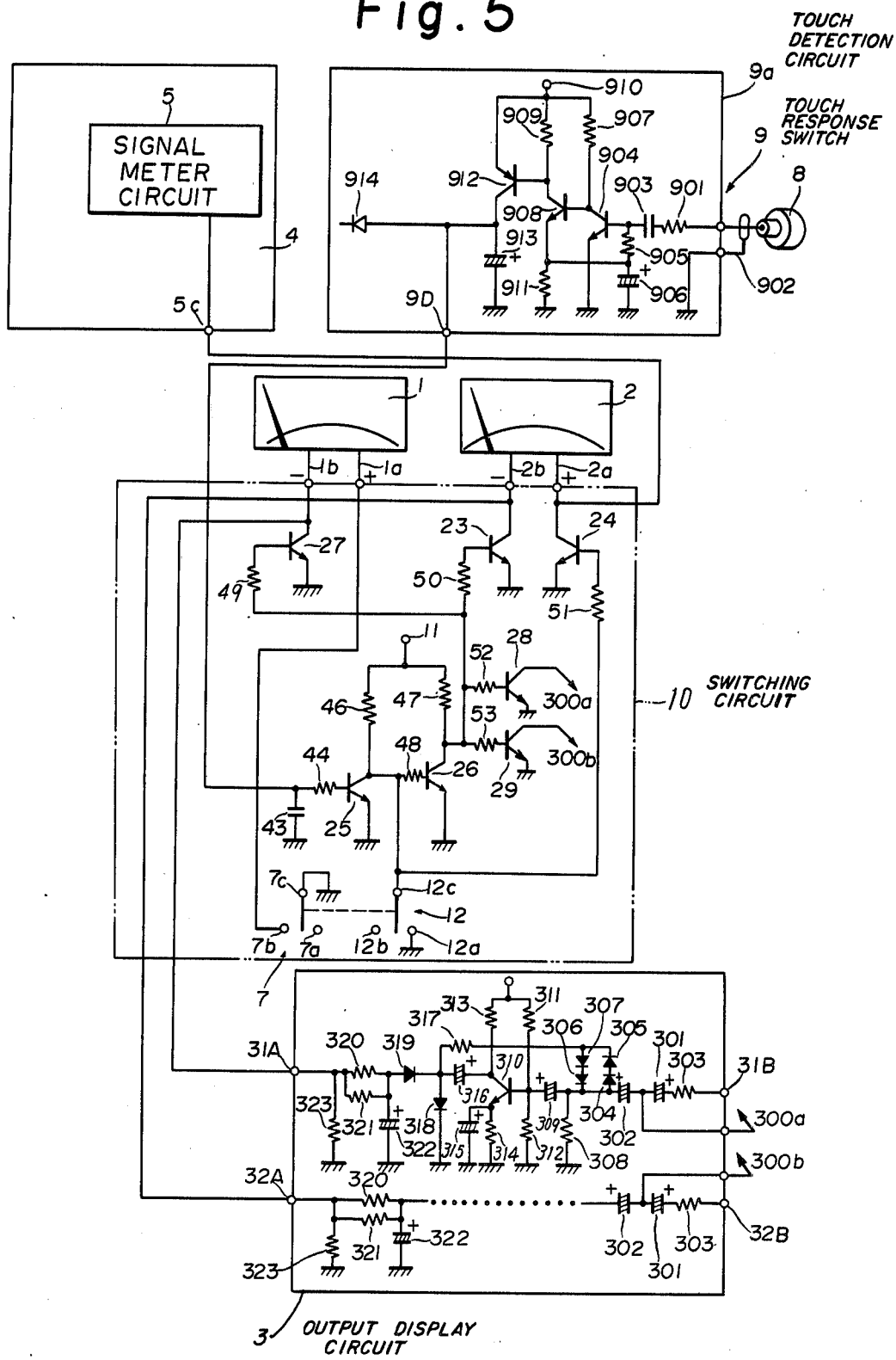
FIG. 5 is a schematic circuit diagram, partly in the form of a block diagram, showing a second example of the display device according to the invention.

A second example of the invention is shown in FIG. 5 in which transistor means is employed in place of the above-described electromagnetic relay 6 thereby providing a contact-less type display device. In FIGS. 5 and 1, like parts are designated by like reference numerals. Therefore the detailed descriptions of these like parts will be omitted.

In FIG. 5, the output terminal 5C of the signal meter circuit 5 and the left and right channel output terminals 31A and 32A of the output display circuit 3 are connected to the respective terminals of the meters 1 and 2 similarly as in the case of FIG. 1. The positive terminal of the left side meter 1, as in the case of FIG. 1, is connected to the stationary contact 7b of the first switch 7. The negative terminal 1b of the left side meter 1, the negative terminal 2b and the positive terminal 2a of the right side meter 2 are respectively connected to the collectors of the transistors 27, 23 and 24 whose emitters are grounded. The left and right channels of the output display circuit 3 are connected to the collectors of transistors 28 and 29 whose emitters are grounded. The output terminal 9D of the touch detection circuit 9a is grounded through a capacitor 43 and is further connected through a resistor 44 to the base of a transistor 25 whose emitter is grounded. The collector of the transistor 25 is connected to the power supply terminal 11 through a resistor 46 and is further connected through a resistor 48 to the base of a transistor 26 whose emitter is grounded. The collector of the transistor 25 is further connected through a resistor 51 to the base of the aforementioned transistor 24. The collector of the transistor 26 is connected through a resistor 47 to the power supply terminal 11 and is further connected through resistors 49, 50, 52 and 53 to the bases of the aforementioned transistors 27, 23, 28 and 29 respectively. Furthermore the collector of the transistor 25 is connected through a resistor 51 to the base of the transistor 24 and is further connected to the movable contact 12c of the second switch 12 operating in association with the first switch 7. Thus the collector of the transistor 25 is selectively connected to and disconnected from the ground by the operation of the switch 12.

In the second example thus constituted, if the movable contacts 7c and 12c of the first and second switches 7 and 12 are connected to the stationary contacts 7b and 12b, respectively, under the condition that a person does not contact the tuning knob 8, the potential at the output terminal 9D of the touch detection circuit 9a is maintained at the low level to render the transistor 25 non-conductive. Therefore the collector of the transistor 25 is at a high potential and the transistors 26 and 24 are rendered conductive. Upon the transistors 26 becoming conductive, the transistors 27 and 23 are rendered non-conductive. In other words, the positive terminal 1a of the left side meter 1 is grounded through the first switch 7, while the negative terminal 1b is not grounded because of the transistor 27; the positive terminal 2a of the right side meter 2 is grounded through the transistor 24, while the negative terminal 2b is not grounded because of the transistor 23. Therefore, similarly as in the case of FIG. 2, the left side meter 1 indicates the left channel output of the output amplifier section and the right side meter 2 indicates the right channel output of the output amplifier section.

In the case where the first and second switches 7 and 12 are maintained as described above and a person touches the tuning knob 8 for the tuning operation or the like, the output terminal 9D of the touch detection circuit 9a is maintained at a high potential to render the transistors 26 and 24 non-conductive. Upon the transistor 26 becoming non-conductive, the transistors 27, 23, 28 and 29 are rendered conductive. Accordingly the negative terminal 1b of the left side meter 1 is grounded through the transistor 27 and the negative terminal 2b of the right side meter 2 is grounded through the transistor 23 while the positive terminal 2a of the right side meter 2 is brought into non-grounded state. Thus, similarly as in the case of FIG. 3, the left side meter 1 is rendered inoperable, while the right side meter 2 indicates the radio wave strength of the antenna input in the tuner section 4. In this operation, there may be the possibility that the left and right channel outputs of the output amplifier section applied to the negative terminals 1b and 2b of the meters 1 and 2 are not shorted completely to the ground potential due to the existence of the saturation resistances of the transistors 27 and 23 so that a mixture of the amplifier output voltage signals to the meters thereby causing indication errors. However, since the left and right channel output signals in the output display circuit 3 are shorted to the ground through the lines 300a and 300b upon the transistors 28 and 29 becoming conductive, such signal mixing can be positively prevented.

When the movable contacts 7c and 12c of the first and second switches 7 and 12 are connected to the stationary contacts 7a and 12a thereof respectively, the positive terminal 1a of the left side meter 1 becomes free from the ground, while the collector of the transistor 25 is grounded. Accordingly the transistors 26 and 24 are rendered non-conductive irrespective of the state of the transistors 25. When the transistors 26 becomes non-conductive, the transistors 27, 23, 28 and 29 are rendered conductive. In this operation, the negative terminal 1b of the left side meter 1 is shorted to the ground through the transistor 27, while the negative terminal 2b of the right side meter 2 is shorted to the ground through the transistor 23 and its positive terminal 2a is brought into non-grounded state. Thus, similarly as in the case of FIG. 4, the left side meter 1 is rendered inoperable, while the right side meter 2 indicates the radio wave strength of the antenna input of the tuner section 4 irrespective of whether a person touches the tuning knob 8 or not.

In this instance also, the transistors 28 and 29 become conductive and therefore the output signals prior to logarithmic amplification in the output display circuit 3 are shorted to the ground. Thus, signal mixing in the output amplifier section can be prevented.

In the above-described two examples, the left side meter 1 is employed for indicating only the left channel output level of the output amplifier section and the right side meter 2 is employed for indicating both the radio wave strength of the antenna input and the right channel output level of the output amplifier section. However, if necessary, the left side meter 1 may be employed concurrently with a tuning meter. It is, of course, possible to use the left side meter for the indication of the left channel output level and the radio wave strength of the antenna input.

As is apparent from the above description, in this invention, a common single meter (or the right side meter in the examples) is employed as a signal meter indicating the radio wave strength of an antenna input and as an output level meter indicating the output level of the output amplifier section and the functions of the meter can be selected with the aid of the selecting means. Accordingly it is possible to reduce the number of meters provided in such electrical equipment as a receiver having a tuner section and an output amplifier section. As a result, the manufacturing cost of such electrical equipment can be reduced and the space required for the meters of the electrical equipment can be reduced, which leads to miniaturization of the electrical equipment and to increase in freedom of an ornamental design of the equipment, especially the front panel board thereof. In addition, in the case where the selecting means is constituted with the tuning knob as the touch responsive switch, the meter can be so designed that it functions as an output level meter during the normal operating period and it is automatically changed to function as a signal meter when a person touches the tuning knob for the tuning operation. This will eliminate the meter switching operation to realize simplified operation of the electrical equipment.

While the invention has been described by reference to preferred embodiments thereof, it will be obvious to those skilled in the art that various changes and modifications may be made therein without departing from the invention and it is intended, therefore, to cover in the appended claims all such changes and modifications as fall within the true spirit and scope of the invention.

What is claimed is:

1. A display device for displaying signal levels of various sections of electrical equipment having a tuner section and an output amplifier section, comprising at least one meter having a pair of input terminals; and a meter selection control circuit connected to said input terminals of the meter and receiving signals from said tuner section and output amplifier section for causing said meter to selectively indicate a radio wave strength of an antenna input in said tuner section and an output level of a channel in said output amplifier section; said meter selection control circuit comprising a touch detection circuit which produces a touch detection signal when a person touches a tuning knob of said tuner section and a switching circuit which operates in response to said touch detection signal to cause said meter to display the radio wave strength when the touch detection signal is present and the output level of said output amplifier section in the absence of the touch detection signal.

2. A display device as claimed in claim 1, in which said switching circuit comprises: an electromagnetic relay including a movable contact and a pair of stationary contacts, said movable contact being connected to a ground potential, one of said stationary contacts having applied thereto a signal representing the output level of said output amplifier section and being connected to one of said input terminals of the meter, the other of said stationary contacts having applied thereto a signal representing the radio wave strength of the antenna input in said tuner section and being connected to the other of said input terminals of the meter; and a relay operation control circuit for controlling the operation of said relay in response to said touch detection signal thereby causing said meter to display said output level when said movable contact is in contact with said one stationary contact and said radio wave strength when the movable contact is in contact with said other stationary contact.

3. A display device as claimed in claim 2, in which said one input terminal of said meter is a negative input terminal, and said other input terminal of said meter is a positive input terminal.

4. A display device as claimed in claim 2, in which said relay operation control circuit comprises: a first transistor having its base connected to an output terminal of said touch detection circuit, its collector connected to a power supply, and its emitter grounded; and a second transistor having its base connected to the collector of said first transistor, its collector connected to the power supply through a coil of said electromagnetic relay, and its emitter grounded thereby controlling said movable contact of the relay to be in contact with said one stationary contact when said touch detection signal is present at the base of said first transistor and with said other stationary contact in the absence of the touch detection signal there.

5. A display device as claimed in claim 2, in which said relay operation control circuit further comprises a switch for controlling energization of said electromagnetic relay, said electromagnetic relay being under the control of said touch detection signal when said switch is in one state and out of the control of the touch detection signal when said switch is in the other state to maintain said movable contact of the relay in contact with said one stationary contact.

6. A display device as claimed in claim 4, in which a switch for controlling energization of said electromagnetic relay is interposed between said coil of said electromagnetic relay and said power supply.

7. A display device as claimed in claim 1, in which said switching circuit comprises: means for applying a signal representing the output level of said output amplifier section to one of said input terminals of the meter; means for applying a signal representing the radio wave strength to the other of the input terminals of the meter; a first switching element connected between said one input terminal of said meter and the ground; a second switching element connected between said other input terminal of said meter and the ground; and a switching control circuit which operates to render said first switching element conductive when said touch detection signal is produced and to render said second switching element conductive when said touch detection signal is not produced.

8. A display device as claimed in claim 7, in which said first switching element and said second switching element are a third transistor and a fourth transistor respectively.

9. A display device as claimed in claim 8, in which said switching control circuit further comprises a fifth transistor whose state is changed in response to said touch detection signal, and a sixth transistor connected to the output of said fifth transistor, operations of said third and fourth transistors being controlled by outputs of said fifth and sixth transistors.

10. A display device as claimed in claim 9, in which the collectors of said third and fourth transistors are connected to said one input terminal and said other input terminal of said meter, respectively, the emitters of said third and fourth transistors being grounded, the base of said fifth transistors being connected to the output terminal of said touch detection circuit, the emitter of said fifth transistor being grounded, the collector of said fifth transistor being connected to said power supply and to the base of said fourth transistor, the base of said sixth transistor being connected to the collector of said fifth transistor, the emitter of said sixth transistor being grounded, the collector of said sixth transistor being connected to the power supply and to the base of said third transistor.

11. A display device as claimed in claim 8, in which said switching control circuit further comprises a switch for controlling a state of said fourth transistor and in which when said switch is in one state said fourth transistor is controlled by said touch detection signal, and when said switch is in the other state said fourth transistor is rendered non-conductive so that said meter is caused to display said radio wave strength.

12. A display device as claimed in claim 10, in which said switching control circuit further comprises a seventh transistor having the base connected to the collector of said sixth transistor, the emitter connected to the ground and the collector connected to an output level signal transmission line of said output amplifier section.

13. A display device as claimed in claim 5, further comprising another meter for indicating an output level of another channel in said output amplifier section and having a pair of input terminals, one of the input terminals of said meter for receiving an output level signal of said another channel in the output amplifier section; another switch connected between the other of the input terminals of said meter and the ground and interlocked with said switch for controlling said relay so that said another switch is closed when said switch for controlling the relay is in said one state; and a third switching element connected between said one input terminal of said meter and the ground and controlled in response to said touch detection signal.

14. A display device as claimed in claim 11, further comprising another meter for indicating an output level of another channel in said output amplifier section and having a pair of input terminals, one of the input terminals of said meter for receiving an output level signal of said channel in the output amplifier section; another switch connected between the other of the input terminals of said meter and the ground and interlocked with said switch for controlling said fourth transistor so that said switch is closed when said switch for controlling the fourth transistor is in said one state; and a fourth switching element connected between said one input terminal of said meter and the ground and controlled in response to said touch detection signal.

15. A display device for displaying signal levels of various sections in electrical equipment having a tuner section and an output amplifier section for amplifying signals of a first channel and a second channel, comprising: a first meter; a second meter; and a meter selection control circuit for selectively causing said meters to display first and second channel output levels produced by said output amplifier section and one of said meters a radio wave strength of an antenna input of said tuner section; said meter selection control circuit comprising a touch detection circuit for producing a touch detection signal when a person touches a tuning knob of said tuner section; and a switching circuit for causing one of said two meters to display the radio wave strength of the antenna input of said tuner section when said touch detection signal is present and for causing said first and second meters to display the first and second channel output levels of said output amplifier section, respectively, in the absence of the touch detection signal.

* * * * *